(12) United States Patent
Huang et al.

(10) Patent No.: US 9,680,435 B1
(45) Date of Patent: Jun. 13, 2017

(54) METHOD AND DEVICE FOR IMPROVING ACOUSTICS OF AN AM DEMODULATION OUTPUT SIGNAL

(71) Applicant: Beken Corporation, Shanghai (CN)

(72) Inventors: Yiming Huang, Shanghai (CN); Weifeng Wang, Shanghai (CN)

(73) Assignee: Beken Corporation, Shanghai (CN)

( * ) Notice: Subject to any disclaimer, the term of this patent is extended or adjusted under 35 U.S.C. 154(b) by 0 days.

(21) Appl. No.: 15/257,418

(22) Filed: Sep. 6, 2016

(30) Foreign Application Priority Data

Aug. 22, 2016 (CN) .......................... 2016 1 0702026

(51) Int. Cl.
*H04H 20/49* (2008.01)
*H03G 3/30* (2006.01)
*H03M 1/12* (2006.01)

(52) U.S. Cl.
CPC .......... *H03G 3/3005* (2013.01); *H03M 1/124* (2013.01); *H03G 3/3052* (2013.01); *H03G 3/3068* (2013.01)

(58) Field of Classification Search
CPC ..... H03G 3/005; H03G 3/3052; H03G 3/3068
USPC .......................................... 381/119, 1–3, 15
See application file for complete search history.

(56) References Cited

U.S. PATENT DOCUMENTS

| | | | |
|---|---|---|---|
| 2007/0049223 A1* | 3/2007 | Nishizawa | ............. H04H 20/30 455/182.3 |
| 2013/0029621 A1* | 1/2013 | Nakata | ................... H04B 1/109 455/161.3 |

* cited by examiner

*Primary Examiner* — Disler Paul
(74) *Attorney, Agent, or Firm* — Perkins Coie LLP

(57) ABSTRACT

A method for improving acoustics of amplitude modulation (AM) audio signal, comprising: amplifying and mixing, with an amplitude modulation (AM) front-end module, an analog AM signal and an automatic gain control (AGC) signal from an AGC module; converting and sampling, with an analog-digital converter and down-sampling module, the amplified and mixed signal to generate a digital AM signal; digitally mixing, with a digital mixer module, the digital AM signal to generate a first digital AM envelope signal; compensating, with an AM compensator module, the first digital AM envelope signal by an AM compensating AGC signal from the AM compensator module to generate a second digital AM envelope signal; demodulating, with a demodulation module, the second digital AM envelope signal; and outputting, with an output module, a demodulated AM audio signal.

10 Claims, 5 Drawing Sheets

METHOD AND DEVICE FOR IMPROVING ACOUSTICS OF AN AM DEMODULATION OUTPUT SIGNAL

CLAIM OF PRIORITY

This application claims priority to Chinese Application number 201610702026.X, entitled "Method and Device for Improving Acoustics of an AM Demodulation Output Signal," filed on Aug. 22, 2016 by Beken Corporation, which is incorporated herein by reference.

TECHNICAL FIELD

The present application relates to an amplitude modulation (AM) receiver and more particularly, but not exclusively, to a method and device for improving acoustics of an AM demodulation output signal.

BACKGROUND OF THE INVENTION

In a traditional AM receiver, there are abrupt changes in direct current (DC) and amplitude of the output signal and thus affects the sound quality of the output signal. The abrupt changes can be caused by the gain from an automatic gain control (AGC) module, an effect of $(1-e^{-\omega_{HPF}t})$ in an AM high-pass filter module and an effect of $(1-e^{-\omega_{LPF}t})$ in the AM low-pass filter module in the receiver. For example, if an amplitude value of an input signal changes from A to B due to the gain change from the AGC module, the output signal of the AM receiver can have an abrupt change $$\frac{B-A}{A}$$

in DC of the output signal and an abrupt change B/A in amplitude of the output signal.

To eliminate these abrupt changes, a new method and device for improving acoustics of AM demodulation output signal may be necessary.

BRIEF DESCRIPTION OF THE INVENTION

According to an embodiment of the invention, a method and device use an AM compensator module to reduce the abrupt changes in DC and amplitude of the output signal and improve the sound quality of the output signal.

In an embodiment, a method comprises: amplifying and mixing, with an amplitude modulation (AM) front-end module, an analog AM signal and an automatic gain control (AGC) signal from an AGC module; converting and sampling, with an analog-digital converter and down-sampling module, the amplified and mixed signal to generate a digital AM signal; digitally mixing, with a digital mixer module, the digital AM signal to generate a first digital AM envelope signal; compensating, with an AM compensator module, the first digital AM envelope signal by an AM compensating AGC signal from the AM compensator module to generate a second digital AM envelope signal; demodulating, with a demodulation module, the second digital AM envelope signal to output a demodulated AM audio signal; and outputting, with an output module, a demodulated AM audio signal.

In another embodiment, the method further comprises: digitally rotating, with a cordic (coordinated rotation digital computer) module, the second digital AM envelope signal; filtering, with an AM high-pass filter module, the rotated signal; filtering, with an AM low-pass filter module, the rotated signal; and normalizing, with an AM normalization module, the signal filtered by the AM low-pass filter module and the signal filtered by the AM high-pass filter module to output the demodulated AM audio signal.

In another embodiment, a device comprises: an automatic gain control (AGC) module configured to generate an AGC signal for adjusting the gain; an amplitude modulation (AM) front-end module connected to the AGC module and configured to amplify and mix an analog AM signal and the AGC signal; an analog-digital converter (ADC) and down-sampling module connected to the AM front-end module and configured to convert and sample the amplified and mixed signal to generate a digital AM signal; a digital mixer module connected to the ADC and down-sampling module and configured to digitally mix the digital AM signal to generate a first digital AM envelope signal; an AM compensator module connected to the digital mixer module and to the AGC module and configured to compensate the first digital AM envelope signal by an AM compensating AGC signal from the AM compensator module to generate a second digital AM envelope signal; a demodulation module connected to the AM compensator module and configured to demodulate the second digital AM envelope signal to output a demodulated AM audio signal; and an output module connected to the demodulation module and configured to output a demodulated AM audio signal.

In still another embodiment, the device further comprises: a cordic module connected to the AM compensator module and configured to digitally rotate the second digital AM envelope signal; an AM high-pass filter module connected to the cordic module and configured to filter the rotated signal; an AM low-pass filter module connected to the cordic module and configured to filter the rotated signal; and an AM normalization module connected to the AM high-pass filter module and to the AM low-pass filter module and configured to normalize the signal filtered by the AM low-pass filter module and the signal filtered by the AM high-pass filter module to output the demodulated AM audio signal.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

Various aspects and examples of the invention will now be described. The following description provides specific details for a thorough understanding and enabling description of these examples. Those skilled in the art will understand, however, that the invention may be practiced without many of these details. Additionally, some well-known structures or functions may not be shown or described in detail, so as to avoid unnecessarily obscuring the relevant description.

The terminology used in the description presented below is intended to be interpreted in its broadest reasonable manner, even though it is being used in conjunction with a detailed description of certain specific examples of the invention. Certain terms may even be emphasized below, however, any terminology intended to be interpreted in any restricted manner will be overtly and specifically defined as such in this Detailed Description section.

Figure 1:
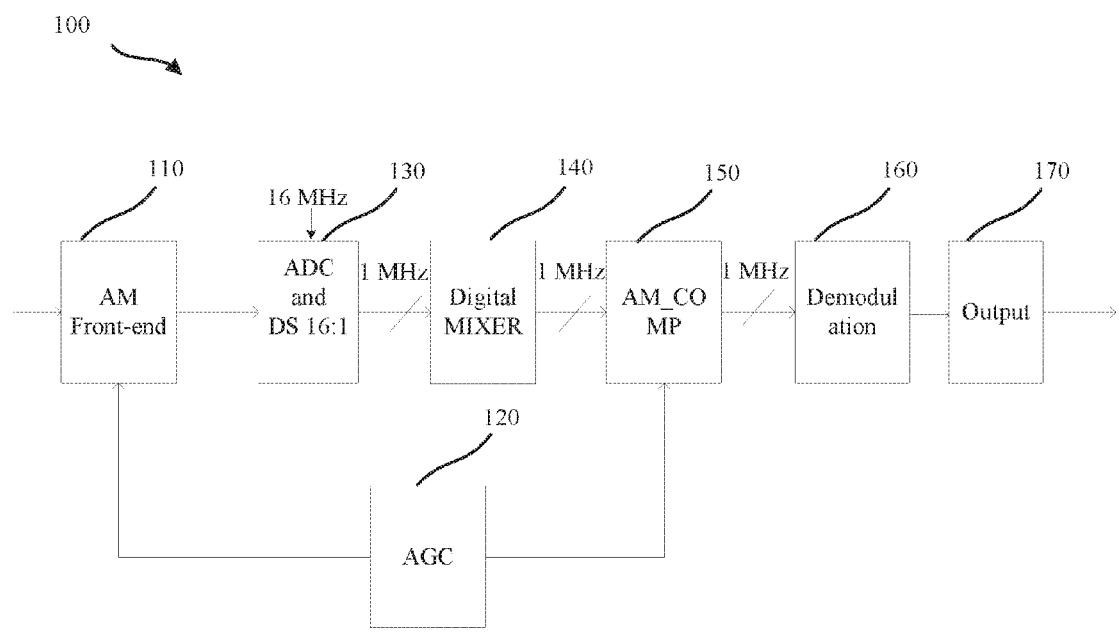
FIG. 1 is a block diagram illustrating an AM receiver for reducing abrupt changes in DC and amplitude of the output signal according to an embodiment of the invention.

FIG. 1 is a block diagram illustrating an AM receiver 100 for reducing abrupt changes in DC and amplitude of the output signal according to an embodiment of the invention. The AM receiver 100 comprises an AM front-end module 110, an automatic gain control (AGC) module 120 connected to the AM front-end module 110, an analog-digital converter (ADC) and down-sampling (DS) module 130 connected to the AGC module 120, a digital mixer module 140 connected to the ADC and DS module 130, an AM compensator module 150 connected to the digital mixer module 140 and to the AGC module 120, a demodulation module 160 connected to the AM compensator module 150 and an output module 170 connected to the demodulation module 160.

In an embodiment, the AM front-end module 110 that is connected to the AGC module 120 receives an AM signal and an AGC signal from the AGC module 120. The AM signal is amplified and mixed in the AM front-end module 110 to output an analog AM signal with a frequency, for example, 125 KHz. The analog AM signal is $A\cdot(1+m \cos(\Omega t))\cdot\cos(\omega t+\sigma t)$. Wherein, the A is amplitude value of an amplitude modulation carrier wave, m is a degree of modulation, $\Omega$ is an angular frequency of an amplitude modulation audio signal, $\omega$ is an angular frequency of the amplitude modulation carrier wave, for example, $2*\pi*125K$, and $\sigma$ is an offset angular frequency of the carrier wave due to the frequency deviation of crystal. In the embodiment, the AGC signal is provided from the AGC module 120 to control the gain of the AM front-end module 110, that is, to control the size of A, and the A will quickly changes to B after the AGC signal is input into the AM front-end module. Wherein, the $B=A\cdot 10^{(0.05*\delta)}$, and the value of gain change is $\delta$ dB ($\delta>0$ represents the gain increases and $\delta<0$ represents the gain decreases).

Then the analog AM signal with 125 KHz is input into the ADC and DS module 130. In the embodiment, the sampling clock of the ADC module is 16 MHz. The analog AM signal is first converted to a digital signal by sampling at 16 MHz, then the digital signal is down sampled by 16 times in the DS module. The ADC and DS module 130 outputs a digital AM signal, which is also $A\cdot(1+m \cos(\Omega t))\cdot\cos(\omega t+\sigma t)$ but with 1 MHz sampling rate. In the embodiment, the output of the module 130 changes from $A\cdot(1+m \cos(\Omega t))\cdot\cos(\omega t+\sigma t)$ to $B\cdot(1+m \cos(\Omega t))\cdot\cos(\omega t+\sigma t)$ due to the gain control from the AGC module 120.

The digital AM signal with 1 MHz sampling rate is input into the digital mixer module 140. Then the module 140 outputs an digital AM envelope signal, which is $A\cdot(1+m \cos(\Omega t))\cdot\cos(\sigma t)$ and with 1 MHz sampling rate. In the embodiment, the output of the module 140 changes from $A\cdot(1+m \cos(\Omega t))\cdot\cos(\sigma t)$ to $B\cdot(1+m \cos(\Omega t))\cdot\cos(\sigma t)$ due to the gain control from the AGC module 120.

In the embodiment, the AM compensator module 150 then receives the signal $A\cdot(1+m \cos(\Omega t))\cdot\cos(\sigma t)$ from the digital mixer module 140 and compensates the signal by an AM compensating AGC signal, i.e., multiplies the signal by the AM compensating AGC signal according to the AGC signal (the AGC signal is valid during the rising edge), the value of gain change $\delta$, and a time of duration for gain change (AM_COMP_TC), and wherein a starting value of the AM compensating AGC signal is A/B and $A/B=10^{(-0.05*\delta)}$.

Still in the embodiment, due to the gain control from the AGC module 120, after the signal received from the digital mixer module 140 changes from $A\cdot(1+m \cos(\Omega t))\cdot\cos(\omega t)$ to $B\cdot(1+m \cos(\Omega t))\cdot\cos(\omega t)$, a starting value of the output of the AM compensator module 150 is $$B\bullet(1+m\cos(\Omega t))\bullet\cos(\sigma t)\bullet\frac{A}{B}=A\bullet(1+m\cos(\Omega t))\bullet\cos(\sigma t)$$

Figure 2:
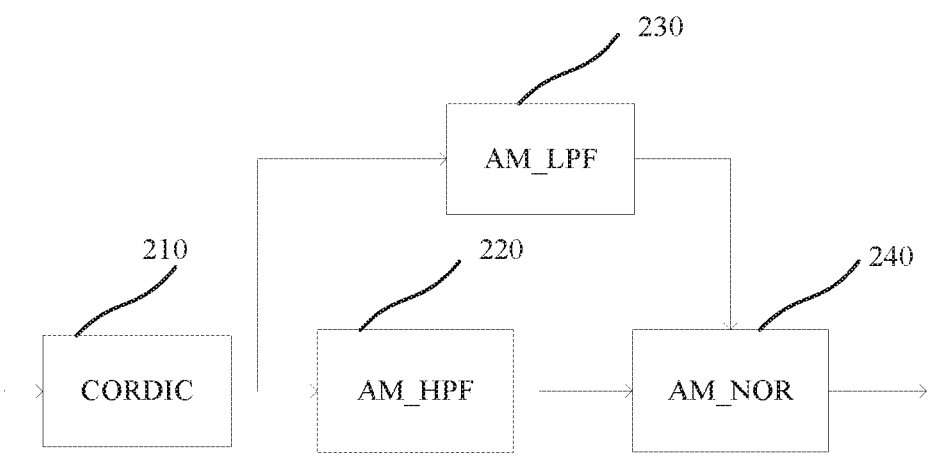
FIG. 2 is a block diagram illustrating a demodulation module of the AM receiver shown in FIG. 1.

Then the starting output $A\cdot(1+m \cos(\Omega t))\cdot\cos(\sigma t)$ is transmitted to the demodulation module 160. As shown in FIG. 2, the demodulation module 160 connected to the AM compensator module 150 further comprises: a cordic module 210, an AM high-pass filter module 220 connected to the cordic module, an AM low-pass filter module 230 connected to the cordic module, and an AM normalization module 240 connected to the AM high-pass filter module and to the AM low-pass filter module.

In one embodiment, the cordic module 210 receives and rotates the signal $A\cdot(1+m \cos(\Omega t))\cdot\cos(\sigma t)$ from the AM compensator module 150 and outputs a starting value $A\cdot(1+m \cos(\Omega t))$. Then the AM high-pass filter module 220 receives the rotated signal $A\cdot(1+m \cos(\Omega t))$ from the cordic module 210 and wherein the passband of the high-pass filter module 220 is −3 dB and the corner frequency is $\omega_{HPF}$, for example, $2*\pi*100$. Thus, the AM high-pass filter module 220 can remove the DC component from the signal $A\cdot(1+m \cos(\Omega t))$ and output $A\cdot m \cos(\Omega t)$. At the same time, the AM low-pass filter module 230 also receives the rotated signal from the cordic module 210 and wherein the passband of the low-pass filter module 230 is −3 dB and the corner frequency is $\omega_{LPF}$, for example, $2*\pi*20$. Thus, the low-pass filter module 230 can obtain the DC component from the signal $A\cdot(1+m \cos(\Omega t))$ and output A. Then the AM normalization module 240 receives $A\cdot m \cos(\Omega t)$ and A from the AM high-pass filter module 220 and AM low-pass filter module 230 respectively and outputs in $m \cos(\Omega t)$, i.e., $$\frac{A\bullet m\cos(\Omega t)}{A}=m\cos(\Omega t).$$

Still in the embodiment, after the time of duration for gain change, $$AM\_COMP\_TC=\frac{3}{\omega_{LPF}},$$

the value of the AM compensating AGC signal is 1, and an effect $(1-e^{-\omega_{HPF}t})$ of an AM high-pass filter module 220 and an effect $(1-e^{-\omega_{LPF}t})$ of an AM low-pass filter module 230 mostly disappeared. That is, the output of the AM compensator module 150 now is $B\cdot(1+m \cos(\Omega t))\cdot\cos(\sigma t)\cdot 1=B\cdot(1+m \cos(\Omega t))\cdot\cos(\sigma t)$. Then, this output signal $B\cdot(1+m \cos(\Omega t))$ ·cos(σt) is also transmitted to the cordic module 210 of the demodulation module 160. The cordic module 210 then outputs a signal B·(1+m cos(Ωt)). The AM high-pass filter module 220 receives the signal B·(1+m cos(Ωt)), removes the DC component from the signal B·(1+m cos(Ωt)) and outputs B·m cos(Ωt). The low-pass filter module 230 also receives the signal B·(1+m cos(Ωt)), obtains the DC component from the signal B·(1+m cos(Ωt)) and output B. The output of the AM normalization module 240 is also m cos(Ωt). Finally, the output module outputs the demodulated signal without abrupt changes $$\frac{B-A}{A}$$

and B/A.

Figure 3A:
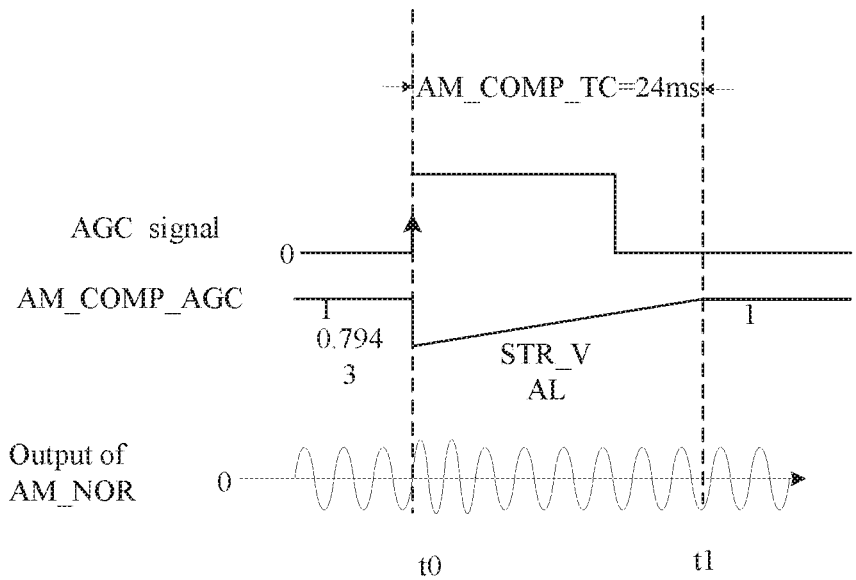
FIGS. 3A and 3B are sequence diagrams illustrating the output of the AM receiver shown in FIG. 1.
Figure 3B:
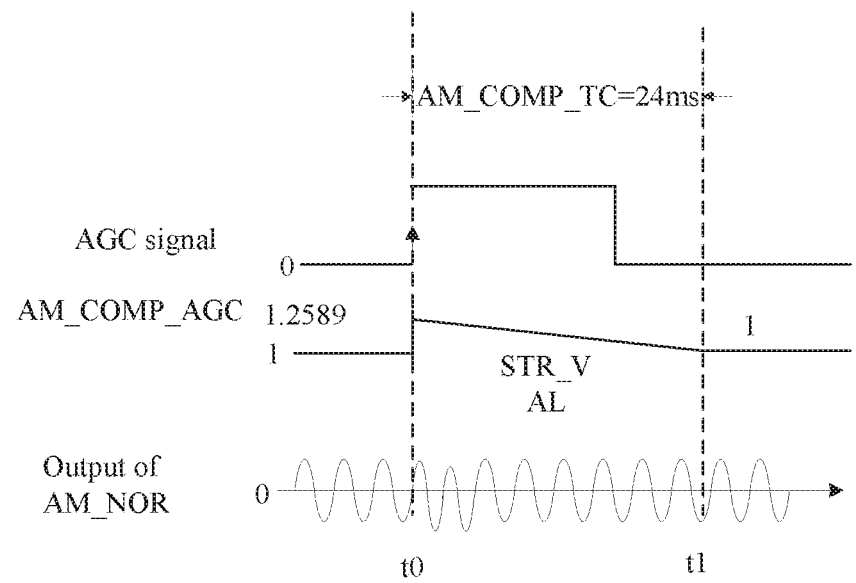

FIGS. 3A and 3B are sequence diagrams illustrating the output of the demodulation module 160 shown in FIG. 1. In one embodiment, as shown in FIG. 3A, wherein δ=2 dB, and the AM compensating AGC signal changes from the value A/B=$10^{(-0.05*\delta)}$=0.7943 to the value 1 after the time of duration for gain change, i.e., $$\text{AM\_COMP\_TC} = \frac{3}{\omega_{LPF}} \approx 24 \text{ ms.}$$

In another embodiment, as shown in FIG. 3B, wherein δ=−2 dB, and the AM compensating AGC signal changes from the value A/B=$10^{(-0.05*\delta)}$=1.2589 to the value 1 after the time of duration for gain change, i.e., $$\text{AM\_COMP\_TC} = \frac{3}{\omega_{LPF}} \approx 24 \text{ ms.}$$

As shown in FIGS. 3A and 3B, there are no abrupt changes in the output of the AM receiver 100.

Figure 4:
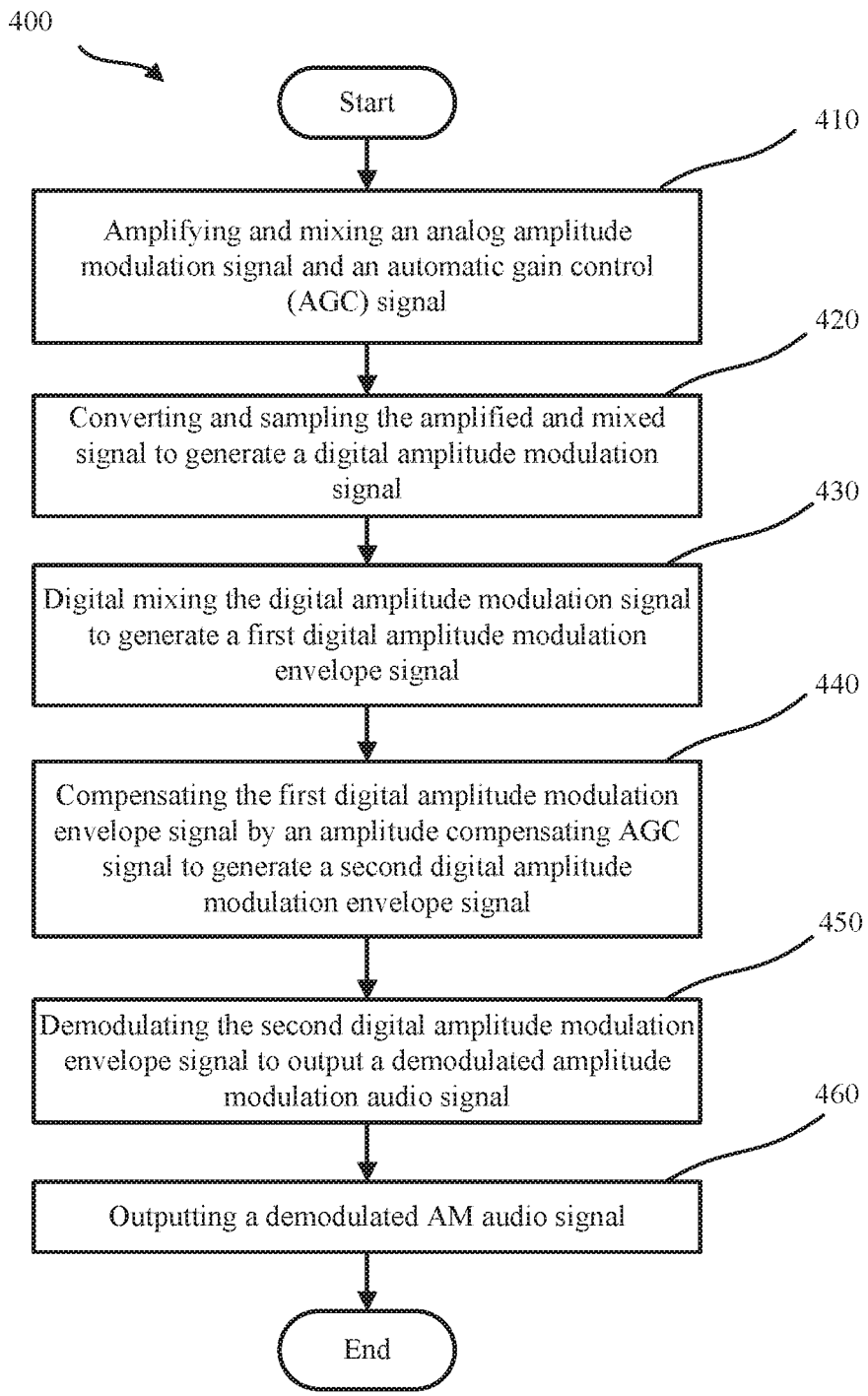
FIG. 4 is a flowchart illustrating a method for reducing abrupt changes in DC and amplitude of the output signal according to an embodiment of the invention.

FIG. 4 is a flowchart illustrating a method 400 for reducing abrupt changes in DC and amplitude of the output signal according to an embodiment of the invention. As shown in FIG. 4, the method 400 comprises amplifying and mixing (410), with an amplitude modulation (AM) front-end module, an analog AM signal and an automatic gain control (AGC) signal from an AGC module; converting and sampling (420), with an analog-digital converter and down-sampling module, the amplified and mixed signal to generate a digital AM signal; digital mixing (430), with a digital mixer module, the digital AM signal to generate a first digital AM envelope signal; compensating (440), with an AM compensator module, the first digital AM envelope signal by an AM compensating AGC signal from the AM compensator module to generate a second digital AM envelope signal; demodulating (450), with a demodulation module, the second digital AM envelope signal to output a demodulated AM audio signal; and outputting (460), with an output module, a demodulated AM audio signal.

In the embodiment, the analog AM signal in step 410 is A·(1+m cos(Ωt))·cos(ωt+σt), wherein the A is amplitude value of an AM carrier wave, m is a degree of modulation, Ω is an angular frequency of an AM audio signal, w is an angular frequency of the AM carrier wave, and σ is an offset angular frequency of the carrier wave, and wherein the A is changed to B after the AGC signal is input into the AM front-end module. The first digital AM envelope signal generated in step 430 is A·(1+m cos(Ωt))·cos(σt).

In further embodiment, compensating the first digital AM envelope signal A·(1+m cos(Ωt))·cos(σt) by the AM compensating AGC signal in step 440 comprises multiplying the first digital AM envelope A·(1+m cos(Ωt))·cos(σt) by the AM compensating AGC signal according to the AGC signal (the AGC signal is valid during the rising edge), a value of gain change δ, and a time of duration for gain change (AM_COMP_TC). Wherein, a starting value of the AM compensating AGC signal is A/B, and A/B=$10^{(-0.05*\delta)}$. Thus, a starting value of the output of the AM compensator module is $$B \bullet (1 + m\cos(\Omega t)) \bullet \cos(\sigma t) \bullet \frac{A}{B} = A \bullet (1 + m\cos(\Omega t)) \bullet \cos(\sigma t).$$

Figure 5:
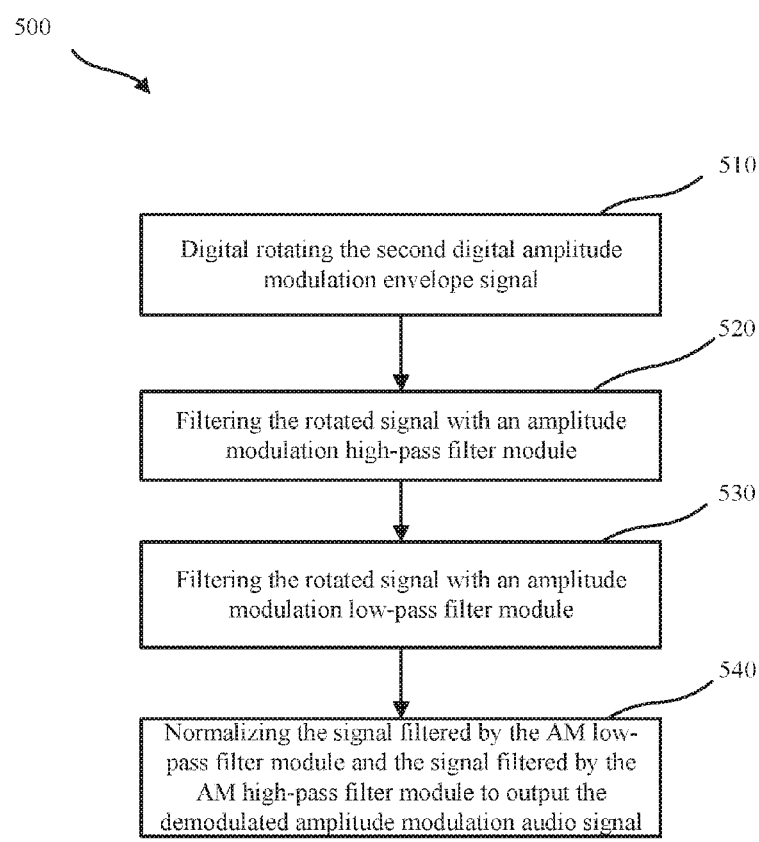
FIG. 5 is a continuation of the method illustrated in FIG. 4.

FIG. 5 is a continuation of the method 500 illustrated in FIG. 4. As shown in FIG. 5, demodulating the second digital AM envelope signal in step 450 further comprises digitally rotating (510), with a cordic module, the second digital AM envelope signal; filtering (520), with an AM high-pass filter module, the rotated signal, wherein the passband of the high-pass filter module is −3 dB and the corner frequency is $\omega_{HPF}$, for example, 2*π*100; filtering (530), with an AM low-pass filter module, the rotated signal, wherein the passband of the low-pass filter module is −3 dB and the corner frequency is $\omega_{LPF}$, for example, 2*π*20; and normalizing (440), with an AM normalization module, the signal filtered by the AM low-pass filter module and the signal filtered by the AM high-pass filter module to output the demodulated AM audio signal.

In the embodiment, the starting signal A·(1+m cos(Ωt))·cos(σt) of the AM compensator module is input to the cordic module. Then the cordic module outputs A·(1+m cos(Ωt)). The AM high-pass filter module receives the signal A·(1+m cos(Ωt)), removes the DC component from the signal A·(1+m cos(Ωt)) and output A·m cos(Ωt). At the same time, the AM low-pass filter module also receives the signal A·(1+m cos(Ωt)) from the cordic module, obtains the DC component from the signal A·(1+m cos(Ωt)) and output A. Then, the AM normalization module receives A·m cos(Ωt) and A from the AM high-pass filter module and AM low-pass filter module respectively and outputs a starting value in cos(Ωt), i.e., $$\frac{A \bullet m\cos(\Omega t)}{A} = m\cos(\Omega t).$$

After the time of duration for gain change, i.e., $$\text{AM\_COMP\_TC} = \frac{3}{\omega_{LPF}},$$

the value of the AM compensating AGC signal is 1, and an effect $(1-e^{-\omega_{HPF}t})$ of the AM high-pass filter module and an effect $(1-e^{-\omega_{LPF}t})$ of the AM low-pass filter module mostly disappeared. That is, the output of the AM compensator module now is B·(1+m cos(Ωt))·cos(σt)·1=B·(1+m cos(Ωt))·cos(σt). Then this output signal B·(1+m cos(Ωt))·cos(σt) is also transmitted to the cordic module. The cordic module receives the signal B·(1+m cos(Ωt))·cos(σt) and outputs B·(1+m cos(Ωt)). The signal B·(1+m cos(Ωt)) then is transmitted to the AM high-pass filter module and the low-pass filter module. The high-pass filter module removes the DC component from the signal B·(1+m cos(Ωt)) and outputs B·m cos(Ωt). The low-pass filter module obtains the DC component from the signal B·(1+m cos(Ωt)) and output B. Finally, the output of the AM normalization module is also m cos(Ωt).

For example, when δ=2 dB, the AM compensating AGC signal changes from the value A/B=10^(−0.05*δ)=0.7943 to the value 1 after the time of duration for gain change, i.e., $$AM\_COMP\_TC = \frac{3}{\omega_{LPF}} \approx 24 \text{ ms},$$

as shown in FIG. 5A. And when δ=−2 dB, the AM compensating AGC signal changes from the value A/B=10^(−0.05*δ)=1.2589 to the value 1 after the time of duration for gain change, i.e., $$AM\_COMP\_TC = \frac{3}{\omega_{LPF}} \approx 24 \text{ ms}.$$

As shown in FIGS. 3A and 3B, there are no abrupt changes in the output of the demodulation module.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural components that do not differ from the literal language of the claims, or if they include equivalent structural components with insubstantial differences from the literal languages of the claims.

What is claimed is:

1. A method, comprising:
   amplifying and mixing, with an amplitude modulation (AM) front-end module, an analog AM signal and an automatic gain control (AGC) signal from an AGC module;
   converting and sampling, with an analog-digital converter and down-sampling module, the amplified and mixed signal to generate a digital AM signal;
   digitally mixing, with a digital mixer module, the digital AM signal to generate a first digital AM envelope signal;
   compensating, with an AM compensator module, the first digital AM envelope signal by an AM compensating AGC signal from the AM compensator module to generate a second digital AM envelope signal;
   demodulating, with a demodulation module, the second digital AM envelope signal; and
   outputting, with an output module, a demodulated AM audio signal;
   wherein the analog AM signal is A·(1+m cos(Ωt))·cos (ωt+σt), wherein the A is amplitude value of an AM carrier wave, m is a degree of modulation, Ω is an angular frequency of an AM audio signal, ω is an angular frequency of the AM carrier wave, and σ is an offset angular frequency of the carrier wave, and wherein the A is changed to B after the AGC signal is input into the AM front-end module;
   wherein the first digital AM envelope signal is A·(1+m cos(Ωt))·cos(σt)
   wherein compensating the first digital AM envelope signal by the AM compensating AGC signal further comprises:
      multiplying the first digital AM envelope by the AM compensating AGC signal according to the AGC signal, a value of gain change, and a time of duration for gain change.

2. The method of claim 1, the value of gain change is δ and a starting value of the AM compensating AGC signal is A/B, wherein the A/B is 10^(−0.05*δ).

3. The method of claim 2, wherein demodulating the second digital AM envelope signal further comprises:
   digitally rotating, with a cordic module, the second digital AM envelope signal;
   filtering, with an AM high-pass filter module, the rotated signal;
   filtering, with an AM low-pass filter module, the rotated signal; and
   normalizing, with an AM normalization module, the signal filtered by the AM low-pass filter module and the signal filtered by the AM high-pass filter module.

4. The method of claim 3, wherein an angular frequency of the AM low-pass filter module is $\omega_{LPF}$ and the time of duration for gain change is $$\frac{3}{\omega_{LPF}}.$$

5. The method of claim 4, wherein the value of the AM compensating AGC signal is 1, the value of the rotated signal is B·(1+m cos(Ωt)), and the value of the demodulated AM audio signal is m cos(Ωt) when the time of duration for gain change is $$\frac{3}{\omega_{LPF}}.$$

6. A device, comprising:
   an automatic gain control (AGC) module configured to generate an AGC signal for adjusting the gain;
   an amplitude modulation (AM) front-end module connected to the AGC module and configured to amplify and mix an analog AM signal and the AGC signal;
   an analog-digital converter and down-sampling module connected to the AM front-end module and configured to convert and sample the amplified and mixed signal to generate a digital AM signal;
   a digital mixer module connected to the ADC and down-sampling module and configured to digitally mix the digital AM signal to generate a first digital AM envelope signal;
   an AM compensator module connected to the digital mixer module and to the AGC module and configured to compensate the first digital AM envelope signal by an AM compensating AGC signal from the AM compensator module to generate a second digital AM envelope signal;
   a demodulation module connected to the AM compensator module and configured to demodulate the second digital AM envelope signal; and an output module connected to the demodulation module and configured to output a demodulated AM audio signal;

wherein the analog AM signal is $A \cdot (1+m\cos(\Omega t)) \cdot \cos(\omega t + \sigma t)$, wherein the A is amplitude value of an AM carrier wave, m is a degree of modulation, $\Omega$ is an angular frequency of an AM audio signal, $\omega$ is an angular frequency of the AM carrier wave, and $\sigma$ is an offset angular frequency of the carrier wave, and wherein the amplitude value of the AM carrier wave is changed from A to B due to a gain change from the AGC module;

wherein the first digital AM envelope signal is $A \cdot (1+m\cos(\Omega t)) \cdot \cos(\sigma t)$; and wherein the AM compensator module further configured to multiply the first digital AM envelope by the AM compensating AGC signal according to the AGC signal, a value of gain change, and a time of duration for gain change.

7. The device of claim 6, the value of gain change is $\delta$ and a starting value of the AM compensating AGC signal is A/B, wherein the A/B is $10^{(-0.05*\delta)}$.

8. The device of claim 7, the demodulation module further comprises:

a cordic module connected to the AM compensator module and configured to digitally rotate the second digital AM envelope signal;

an AM high-pass filter module connected to the cordic module and configured to filter the rotated signal;

an AM low-pass filter module connected to the cordic module and configured to filter the rotated signal; and an AM normalization module connected to the AM high-pass filter module and to the AM low-pass filter module and configured to normalize the signal filtered by the AM low-pass filter module and the signal filtered by the AM high-pass filter module to output the demodulated AM audio signal.

9. The device of claim 8, wherein an angular frequency of the AM low-pass filter module is $\omega_{LPF}$ and the time of duration for gain change is $$\frac{3}{\omega_{LPF}}.$$

10. The device of claim 9, wherein the value of the AM compensating AGC signal is 1, the value of the rotated signal is $B \cdot (1+m\cos(\Omega t))$, and the value of the demodulated AM audio signal is $m\cos(\Omega t)$ when the time of duration for gain change is $$\frac{3}{\omega_{LPF}}.$$

* * * * *